United States Patent
Chen

(10) Patent No.: US 12,215,714 B2
(45) Date of Patent: Feb. 4, 2025

(54) FAN CAGE ASSEMBLY AND ELECTRONIC DEVICE INCLUDING THE SAME

(71) Applicant: WISTRON CORP., New Taipei (TW)

(72) Inventor: Wei-Hao Chen, New Taipei (TW)

(73) Assignee: WISTRON CORP., New Taipei (TW)

( * ) Notice: Subject to any disclaimer, the term of this patent is extended or adjusted under 35 U.S.C. 154(b) by 209 days.

(21) Appl. No.: 18/170,643

(22) Filed: Feb. 17, 2023

(65) Prior Publication Data

US 2024/0093700 A1  Mar. 21, 2024

(30) Foreign Application Priority Data

Sep. 21, 2022 (TW) .................................. 111135666

(51) Int. Cl.
*H05K 7/20* (2006.01)
*F04D 29/52* (2006.01)
*F04D 29/64* (2006.01)

(52) U.S. Cl.
CPC ......... *F04D 29/646* (2013.01); *F04D 29/522* (2013.01); *H05K 7/20172* (2013.01); *H05K 7/20727* (2013.01)

(58) Field of Classification Search
CPC combination set(s) only.
See application file for complete search history.

(56) References Cited

U.S. PATENT DOCUMENTS

| | | | |
|---|---|---|---|
| 6,373,698 B1 * | 4/2002 | Christensen | G06F 1/20 361/679.48 |
| 6,556,437 B1 * | 4/2003 | Hardin | H05K 7/20172 361/679.48 |
| 6,865,078 B1 * | 3/2005 | Chang | H05K 7/20727 361/695 |
| 7,009,841 B2 * | 3/2006 | Chen | H05K 7/20172 415/213.1 |
| 7,048,498 B2 | 5/2006 | Kosugi | |
| 7,068,505 B2 | 6/2006 | Kosugi | |
| 7,230,826 B2 * | 6/2007 | Kyle | H05K 7/20172 165/122 |
| 7,623,344 B2 * | 11/2009 | Beall | H05K 7/20727 361/679.48 |
| 7,661,923 B2 * | 2/2010 | Kosugi | F04D 29/601 220/837 |
| 9,307,673 B2 * | 4/2016 | Chu | H01L 23/467 |
| 9,435,351 B2 * | 9/2016 | Lin | F04D 25/0613 |
| 10,165,696 B1 * | 12/2018 | Blasingame | H05K 5/0221 |

(Continued)

FOREIGN PATENT DOCUMENTS

| | | |
|---|---|---|
| CN | 101128107 A | 2/2008 |
| CN | 104207633 A | 12/2014 |

(Continued)

OTHER PUBLICATIONS

TW Office Action dated Apr. 10, 2023 issued in Taiwan application No. 111135666.

*Primary Examiner* — Lisa Lea-Edmonds
(74) *Attorney, Agent, or Firm* — McClure, Qualey & Rodack, LLP

(57) ABSTRACT

A fan cage assembly includes a cage and a handle mechanism, the handle mechanism includes a mount member including a mount portion and an extension portion respectively located at different sides of the cage and an operative member movably disposed on the extension portion of the mount member.

20 Claims, 15 Drawing Sheets

FIG. 3

(56) References Cited

U.S. PATENT DOCUMENTS

| | | | | |
|---|---|---|---|---|
| 10,470,336 | B2* | 11/2019 | Chen | H05K 7/20172 |
| 10,485,136 | B2* | 11/2019 | Gopalakrishna | G06F 1/181 |
| 10,568,237 | B2* | 2/2020 | Yu | F04D 29/646 |
| 11,378,098 | B2* | 7/2022 | Yang | F04D 19/002 |
| 11,781,555 | B2* | 10/2023 | Chen | F04D 29/602 |
| | | | | 361/126 |
| 11,956,927 | B2* | 4/2024 | Lo | H05K 7/20727 |
| 12,041,756 | B2* | 7/2024 | Zhong | H05K 7/1489 |
| 12,117,012 | B2* | 10/2024 | Chen | F04D 29/602 |
| 2007/0035923 | A1* | 2/2007 | Beall | G06F 1/183 |
| | | | | 361/679.48 |
| 2015/0147166 | A1* | 5/2015 | Lin | F04D 25/0613 |
| | | | | 415/200 |
| 2015/0208548 | A1* | 7/2015 | Chu | H05K 7/20172 |
| | | | | 361/695 |
| 2017/0042060 | A1* | 2/2017 | Chen | F04D 25/0613 |
| 2021/0131450 | A1* | 5/2021 | Yang | H05K 7/14 |
| 2022/0346259 | A1* | 10/2022 | Chang | G06F 1/20 |
| 2023/0417252 | A1* | 12/2023 | Chen | G06F 1/206 |
| 2024/0093700 | A1* | 3/2024 | Chen | H05K 7/20172 |
| 2024/0114648 | A1* | 4/2024 | Yu | H05K 7/20172 |

FOREIGN PATENT DOCUMENTS

| | | |
|---|---|---|
| CN | 210129192 U | 3/2020 |
| CN | 216124209 U | 3/2022 |
| TW | 536116 U | 6/2003 |
| TW | M456073 U1 | 6/2013 |

\* cited by examiner

FAN CAGE ASSEMBLY AND ELECTRONIC DEVICE INCLUDING THE SAME

CROSS-REFERENCE TO RELATED APPLICATIONS

This non-provisional application claims priority under 35 U.S.C. § 119(a) on Patent Application No(s). 111135666 filed in Taiwan (R.O.C.) on Sep. 21, 2022, the entire contents of which are hereby incorporated by reference.

TECHNICAL FIELD

The disclosure relates to a fan cage, more particularly relates to a fan cage assembly and an electronic device including the same.

BACKGROUND

Heat dissipation is necessary to maintain or improve the performance and service life of a server host or computer host. For example, a specific number of fans can be arranged in an array of fan cages so as to provide cooling air to one or more selected areas of the server housing.

To facilitate the maintenance, installation, removal, and replacement of fans, the fan cages are detachable and generally have a handle thereon to facilitate the operation by user. However, in a dense server environment, the space peripheral to the fan cage available for the handle is very limited, thus, conventionally, the handle on fan cage are short, but short handle is unfavorable for user to move or operate the fan cage.

SUMMARY

Accordingly, one aspect of the disclosure is to provide a fan cage assembly and an electronic device including the same capable of solving the problems due to traditional fan cage.

One embodiment of the disclosure provides a fan cage assembly including a cage and a handle mechanism, the handle mechanism includes a mount member including a mount portion and an extension portion respectively located at different sides of the cage and an operative member movably disposed on the extension portion of the mount member.

One embodiment of the disclosure provides an electronic device including a housing and a fan module, the fan module includes a cage disposed on the housing and a handle mechanism, the handle mechanism includes a mount member including a mount portion and an extension portion respectively located at different sides of the cage and an operative member movably disposed on the extension portion of the mount member.

According to the fan cage assembly and the electronic device as discussed in the above embodiments of the disclosure, the extension portion and the mount portion of the mount member of the handle mechanism are respectively located at different sides of the cage and the operative member is movably disposed on the extension portion, thus, the operative member for switching the status of the handle mechanism is movable at a selected side of the cage, making the handle mechanism suitable for being arranged in a narrow space and easier to operate by fingers. As such, the handle mechanism is favorable for facilitating the placement and removal of the fan cage assembly from a limited internal space.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Aspects and advantages of the disclosure will become apparent from the following detailed descriptions with the accompanying drawings. The inclusion of such details provides a thorough understanding of the disclosure sufficient to enable one skilled in the art to practice the described embodiments but it is for the purpose of illustration only and should not be understood to limit the disclosure. On the contrary, it is intended to cover alternatives, modifications, and equivalents as can be included within the spirit and scope of the described embodiments as defined by the appended claims. To this end, those skilled in the relevant art will recognize and appreciate that many changes can be made to the various aspects of the disclosure described herein, while still obtaining the beneficial results of the present disclosure. It will also be apparent that some of the desired benefits of the present disclosure can be obtained by selecting some of the features of the present disclosure without utilizing other features.

It is to be understood that the phraseology and terminology used herein are for the purpose of better understanding the descriptions and should not be regarded as limiting. Unless specified or limited otherwise, the terms "mounted," "connected," and variations thereof are used broadly and encompass both direct and indirect mountings and connections. As used herein, the terms "substantially" or "approximately" may describe a slight deviation from a target value, in particular a deviation within the production accuracy and/or within the necessary accuracy, so that an effect as present with the target value is maintained. Unless specified or limited otherwise, the phrase "at least one" as used herein may mean that the quantity of the described element or component is one or more than one but does not necessarily mean that the quantity is only one. The term "and/or" may be used herein to indicate that either or both of two stated possibilities.

Figure 1:
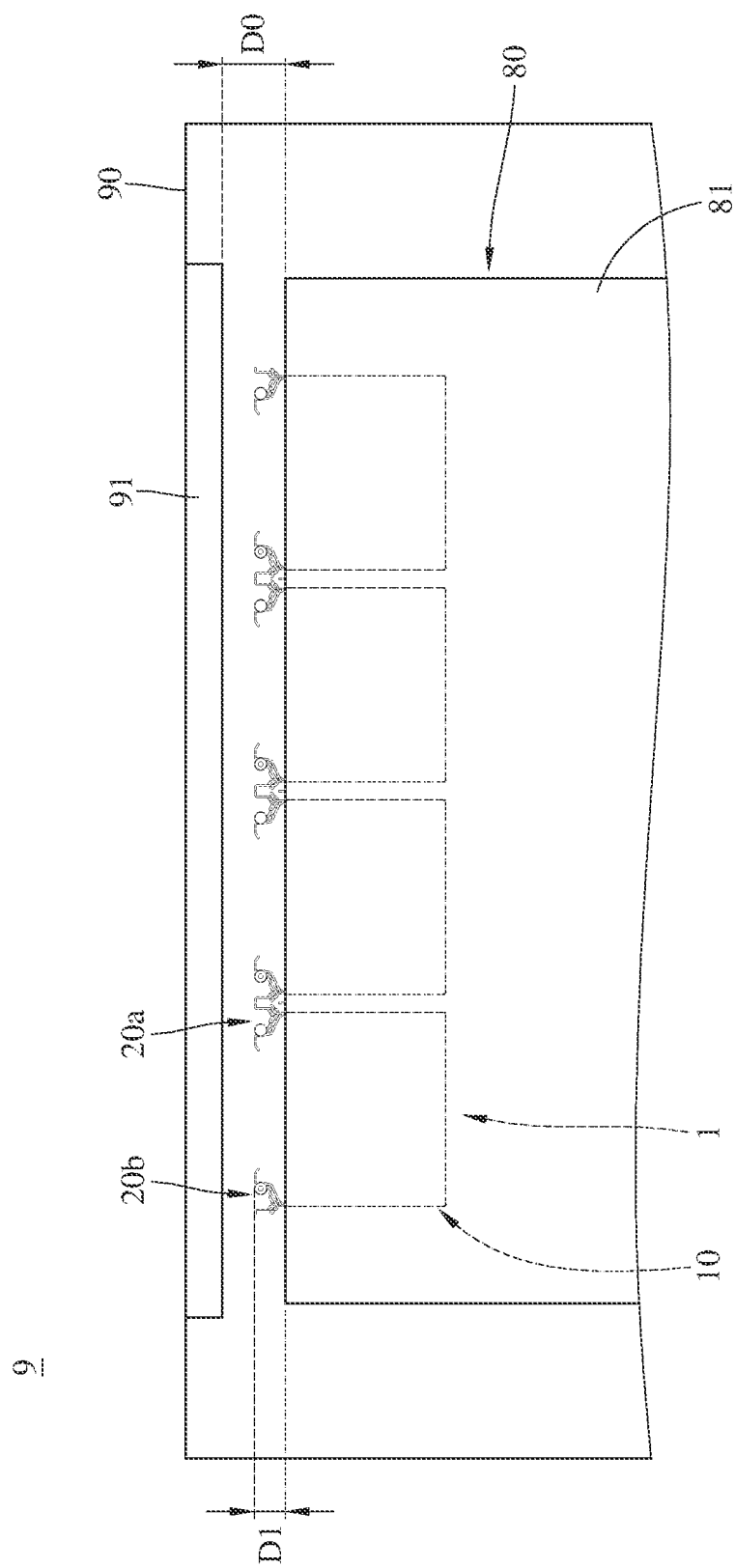
FIG. 1 is a partially-enlarged view of an electronic device according to one embodiment of the disclosure.
Figure 2:
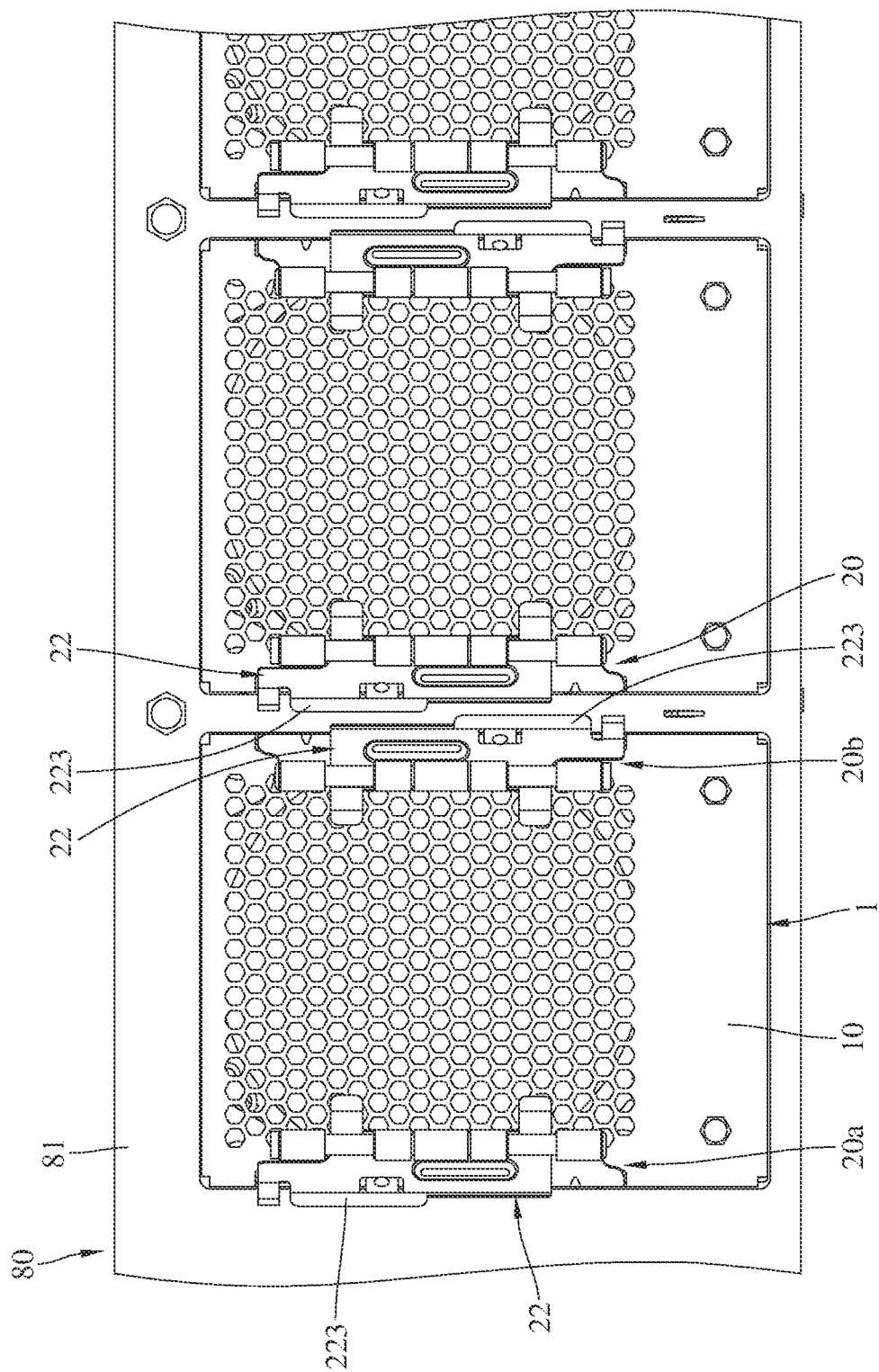
FIG. 2 is a partially-enlarged view of a fan module in FIG. 1.
Figure 3:
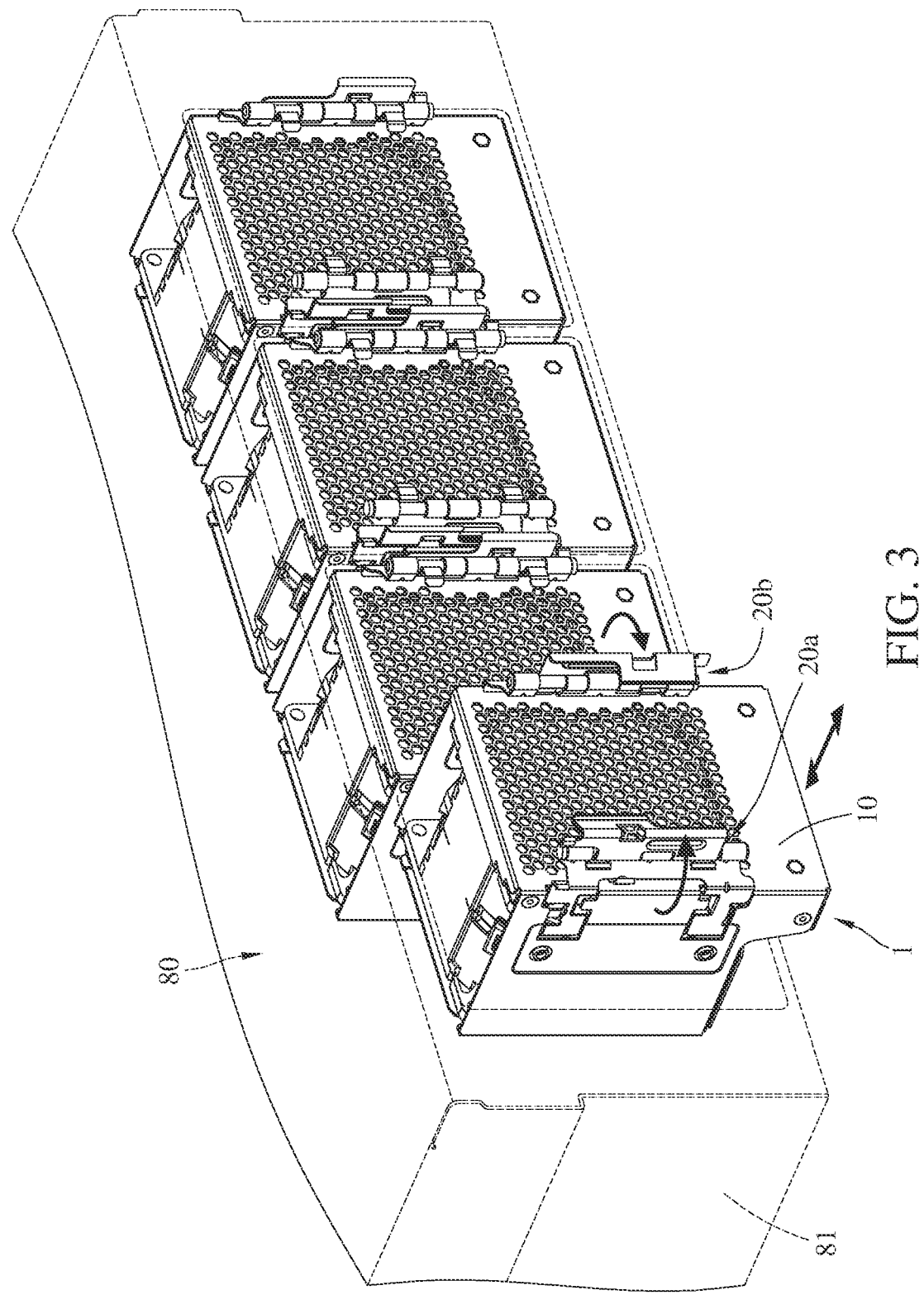
FIG. 3 depicts the placement of one of fan cage assemblies relative to the fan module in FIG. 1.

Firstly, referring to FIGS. 1-3, one embodiment of the disclosure provides an electronic device 9. The electronic device 9 may be, but is not limited to, a server, computer host, or part thereof. The electronic device 9 may include a housing 90 configured for accommodating required electrical/non-electrical components, structures or modules. For example, the housing 90 may accommodate a fan module 80. The fan module 80 may include a module casing 81 configured for accommodating required electrical/non-electrical components, structures or modules. For example, the module casing 81 may accommodate at least one fan cage assembly 1. The fan cage assembly 1 is removably accommodated in the module casing 81. The fan cage assembly 1 may accommodate, for example, one or more fans (not shown).

In addition, the electronic device 9 may further include a rear cover 91, the rear cover 91 is detachably disposed at a side (e.g., rear side) of the housing 90 or is employed as a door at the rear side of the housing 90. The fan cage assembly 1 may be arranged at a side of the module casing 81 located adjacent to the rear cover 91. When the rear cover 91 is opened or removed, the space was occupied by the rear cover 91 becomes an opening for the placement of the fan cage assembly 1 into or removal of the fan cage assembly 1 out of the module casing 81 (as indicated by the arrows in FIG. 3).

To facilitate the placement and removal of the fan cage assembly 1, the fan cage assembly 1 includes at least one handle mechanism arranged at a side of its cage 10. As shown, there may be a first handle mechanism 20a and a second handle mechanism 20b being disposed at a side of the cage 10 that is located adjacent to the rear cover 91. The first handle mechanism 20a and the second handle mechanism 20b may also be called handle mechanisms 20a and 20b hereinafter. The handle mechanisms 20a and 20b may be similar or the same in configuration. The handle mechanisms 20a and 20b are arranged at two opposite sides of the cage 10 and partially located outside the fan module 80. The handle mechanisms 20a and 20b are provided to allow the predetermined operation of the fan cage assembly 1 by the user. The followings may mainly take the handle mechanism 20a as an example for introducing the handle mechanism.

Figure 8:
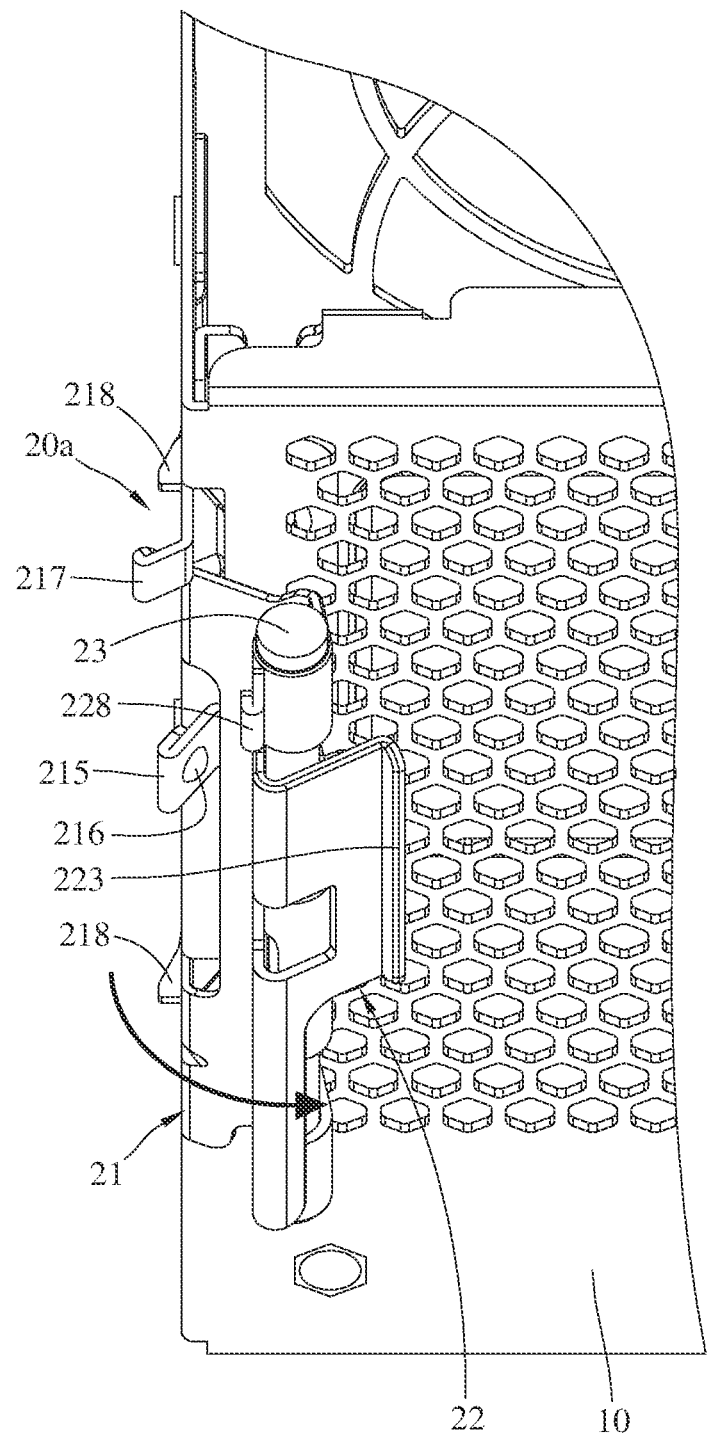
Figure 9:
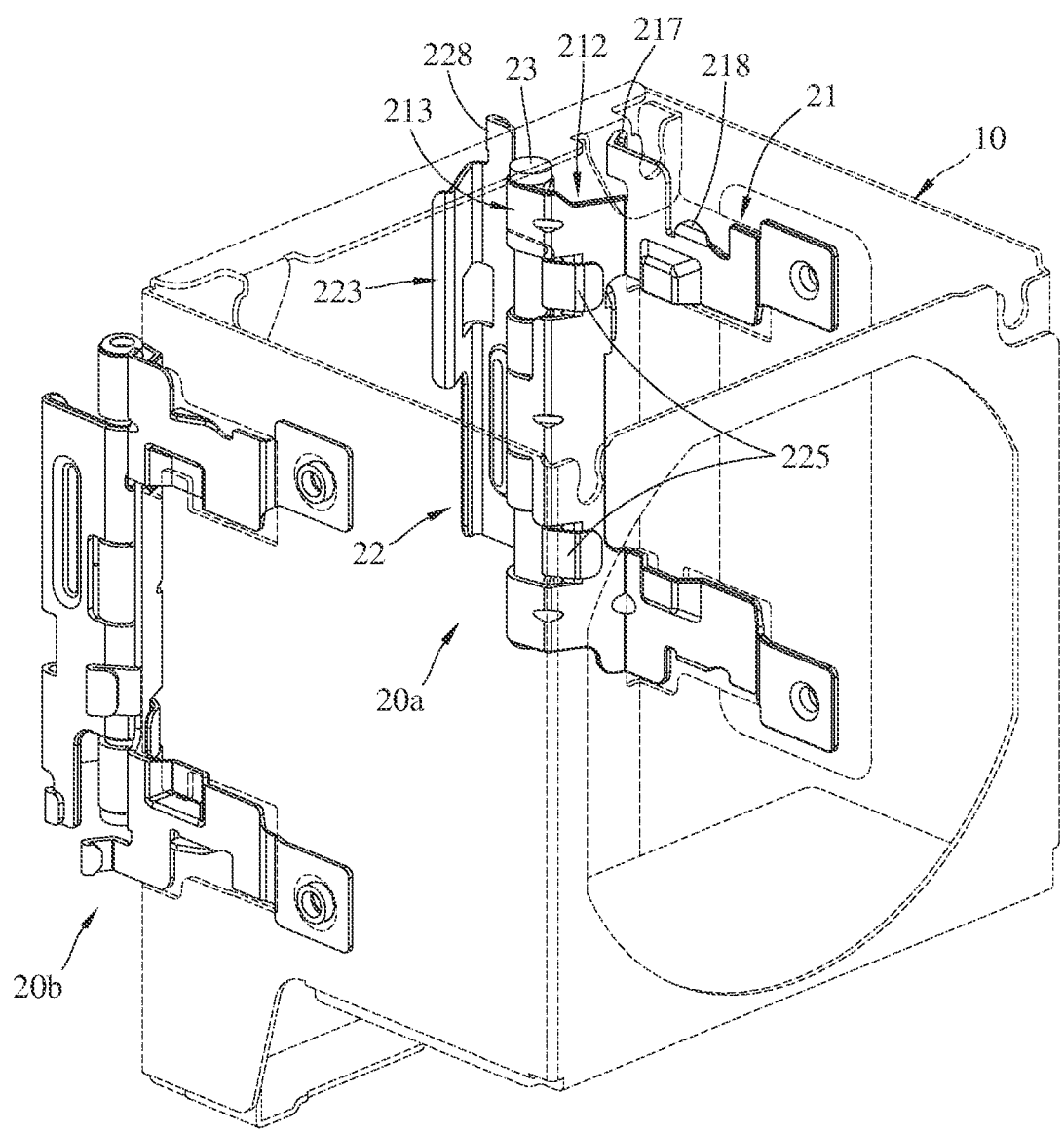
FIG. 9 is a perspective views of the fan cage assembly 1 in FIG. 8.

When the rear cover 91 is closed (as shown in FIG. 1), a distance between the rear cover 91 and the module casing 81 of the fan module 80 denotes to DO. In some application, DO may be short (i.e., the space between the module casing 81 of the fan module 80 and the rear cover 91 is narrow), thus the part of the handle mechanism 20a that is located outside the fan module 80 is required to be adjusted to prevent the handle mechanism 20a from having interference with the rear cover 91. For example, the handle mechanism 20a may be switched to a stored status (as shown in FIGS. 1-2). When the handle mechanism 20a, a distance between the portion of the handle mechanism 20a which is located furthest away from the module casing 81 (or, the cage 10) and the module casing 81 (or, the cage 10) denotes to D1, and D1 is shorter than DO. In other words, when the handle mechanism 20a is switched to the stored status, the length that the handle mechanism 20a protrudes out of the cage 10 is shorter than the distance between the module casing 81 and the rear cover 91. That is, when the handle mechanism 20a is switched to the stored status, the outermost portion of the handle mechanism 20a protrudes from the cage 10 by a first distance (i.e., D1), and D1 is shorter than DO. When the rear cover 91 is opened or removed from the housing 90, the handle mechanism 20a is selectively switched to an operative status (as shown in FIGS. 8-9). When the handle mechanism 20a is in the operative status, the distance between the portion of the handle mechanism 20a which is located furthest away from the module casing 81 (or, the cage 10) and the module casing 81 (or, the cage 10) increases. In other words, when the handle mechanism 20a is switched to the operative status, the length that the handle mechanism 20a protrudes out of the cage 10 is longer so as to provide sufficient area for the user to operate the handle mechanism 20a, thereby facilitating the operation of the fan cage assembly 1. It is noted that the actual values of DO and the actual lengths that the stored status and operative status of the handle mechanism 20a protrudes out of the cage may be determined as required and not intended to limit the disclosure.

Then, the detail of the fan cage assembly 1 will be described below with further reference to FIGS. 3-6. In this embodiment, the fan cage assembly 1 include two handle mechanisms (i.e., the handle mechanisms 20a and 20b) respectively arranged at two opposite sides thereof. Since the handle mechanisms 20a and 20b on each fan cage assembly 1 are similar or the same in configuration, only the operation of one of the handle mechanisms 20a and 20b will be described in detail below.

In this embodiment, the fan cage assembly 1 may include a cage 10 configured for accommodating a fan (not shown) and for the arrangement of the handle mechanisms 20a and 20b. It is noted that the configuration of the cage 10 is not limiting and may be modified as required.

In this embodiment, the handle mechanism 20a may include a mount member 21 and an operative member 22, and the handle mechanism 20b may include another second mount member and another operative member which may have the same configuration and function as that of the handle mechanism 20a. The mount member 21 may be made of any suitable metal or plastic material with required elastic deformability and structural strength. At least part of the mount member 21 may be attached to the cage 10 using any suitable means, such as screws, bolts, rivets, or adhesive. The operative member 22 may also be made of any suitable metal or plastic material with required elastic deformability and structural strength. The operative member 22 is movably disposed on the mount member 21 and therefore is movably disposed on the cage 10 via the mount member 21. Specifically, in this embodiment, the operative member 22 may be pivotably connected to the mount member 21 via a shaft 23 and thus the operative member 22 is pivotable relative to the mount member 21 and the cage 10 about the shaft 23.

In this embodiment, the mount member 21 may include a mount portion 211 and an extension portion 212 connected to the mount portion 211. In the handle mechanism 20b, the mount member may include another mount portion and another extension portion which may have the same configuration and function as that of the handle mechanism 20a. The mount portion 211 means the portion of the mount member 21 that is configured for being fixed to the cage 10 and not outwardly protruding from the cage 10. The extension portion 212 means the portion of the mount member 21 that extends outwardly from the mount portion 211 and is located outside the cage 10. Optionally, the extension portion 212 may be at an angle to the mount portion 211, in other words, the extension portion 212 may be inclined relative to the mount portion 211; thus, the mount portion 211 and the extension portion 212 may be respectively located at different sides of the cage 10. It is noted that the angle between the mount portion 211 and the extension portion 212 may be modified as required and is not intended to limit the disclosure.

Figure 5:
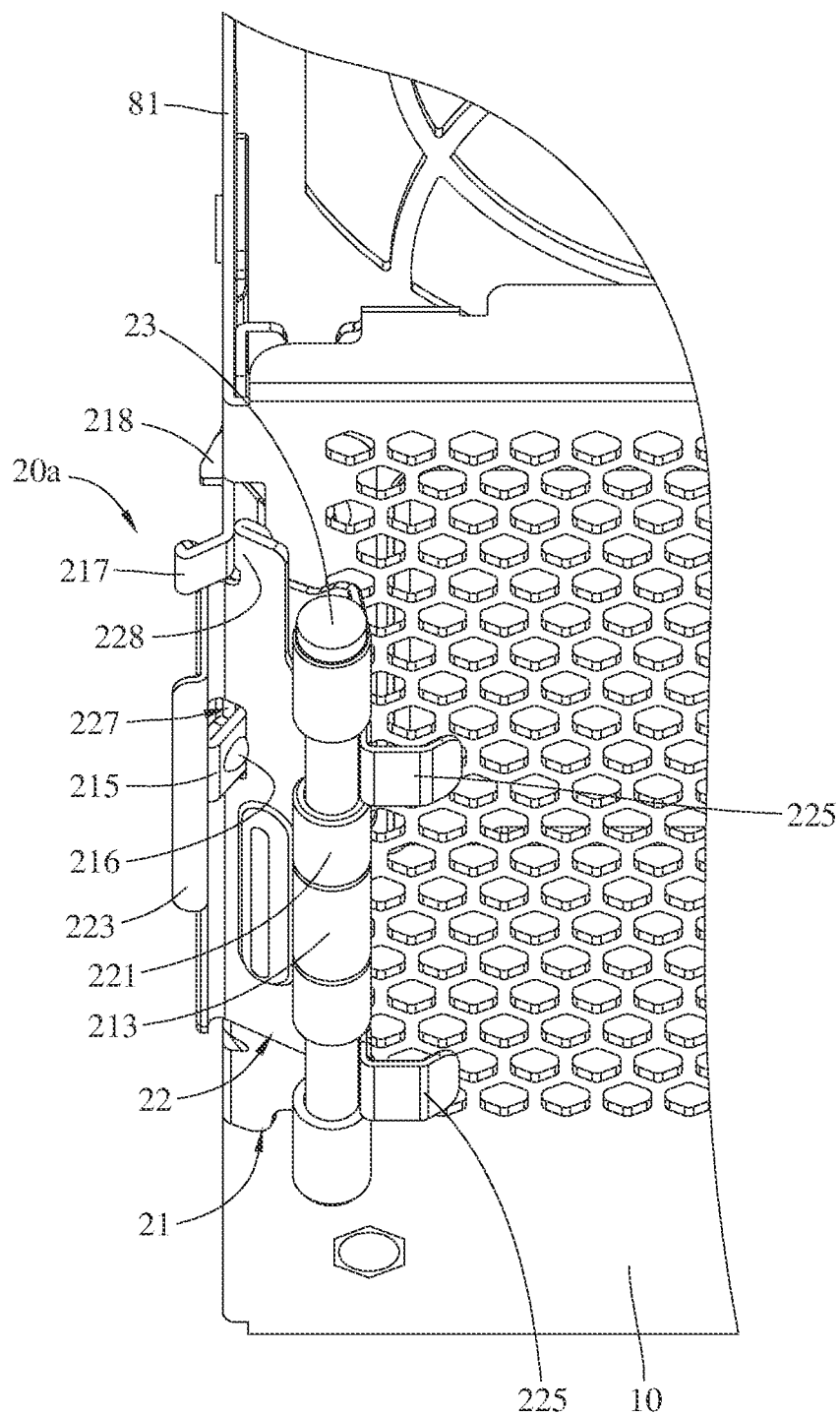
FIGS. 5-6 are partially-enlarged perspective views of a fan cage assembly in FIG. 3, taken in different view angles.
Figure 6:
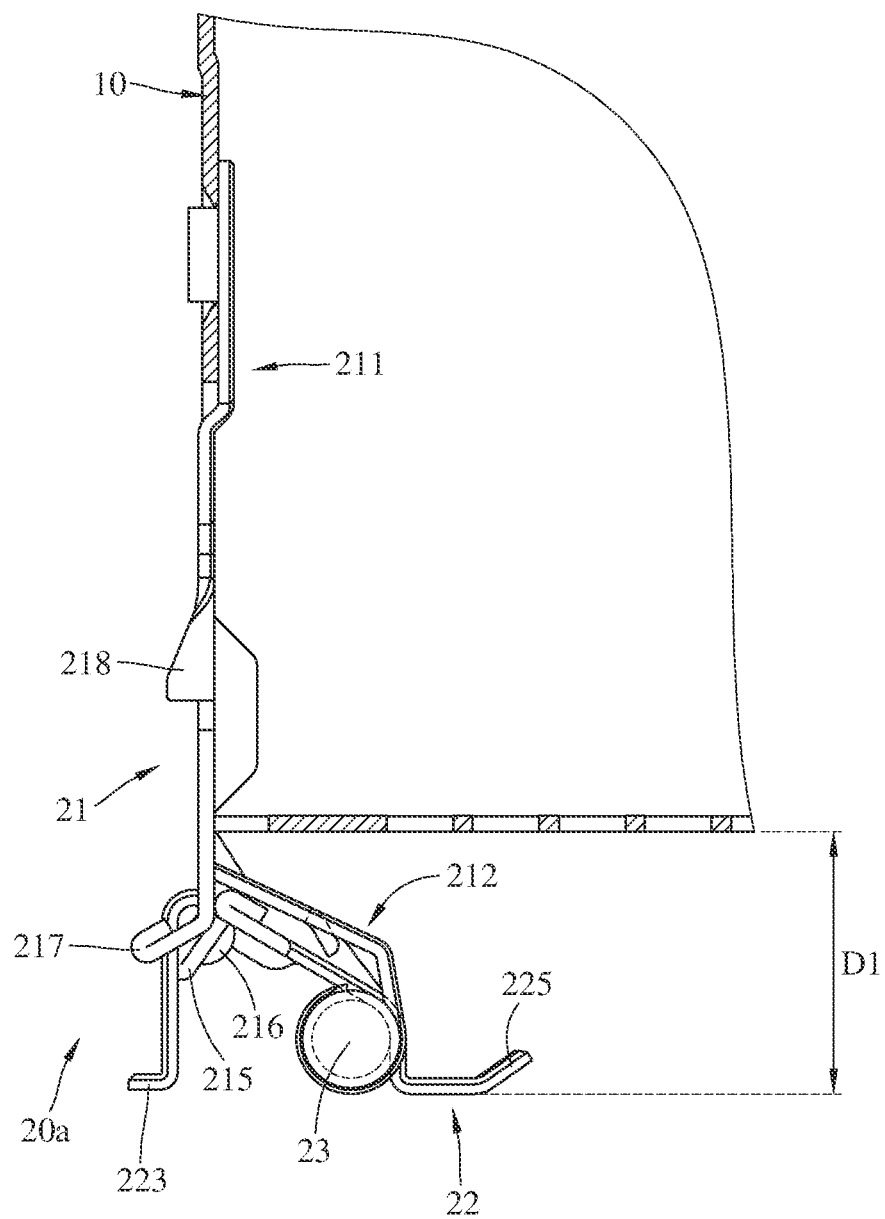
Figure 7:
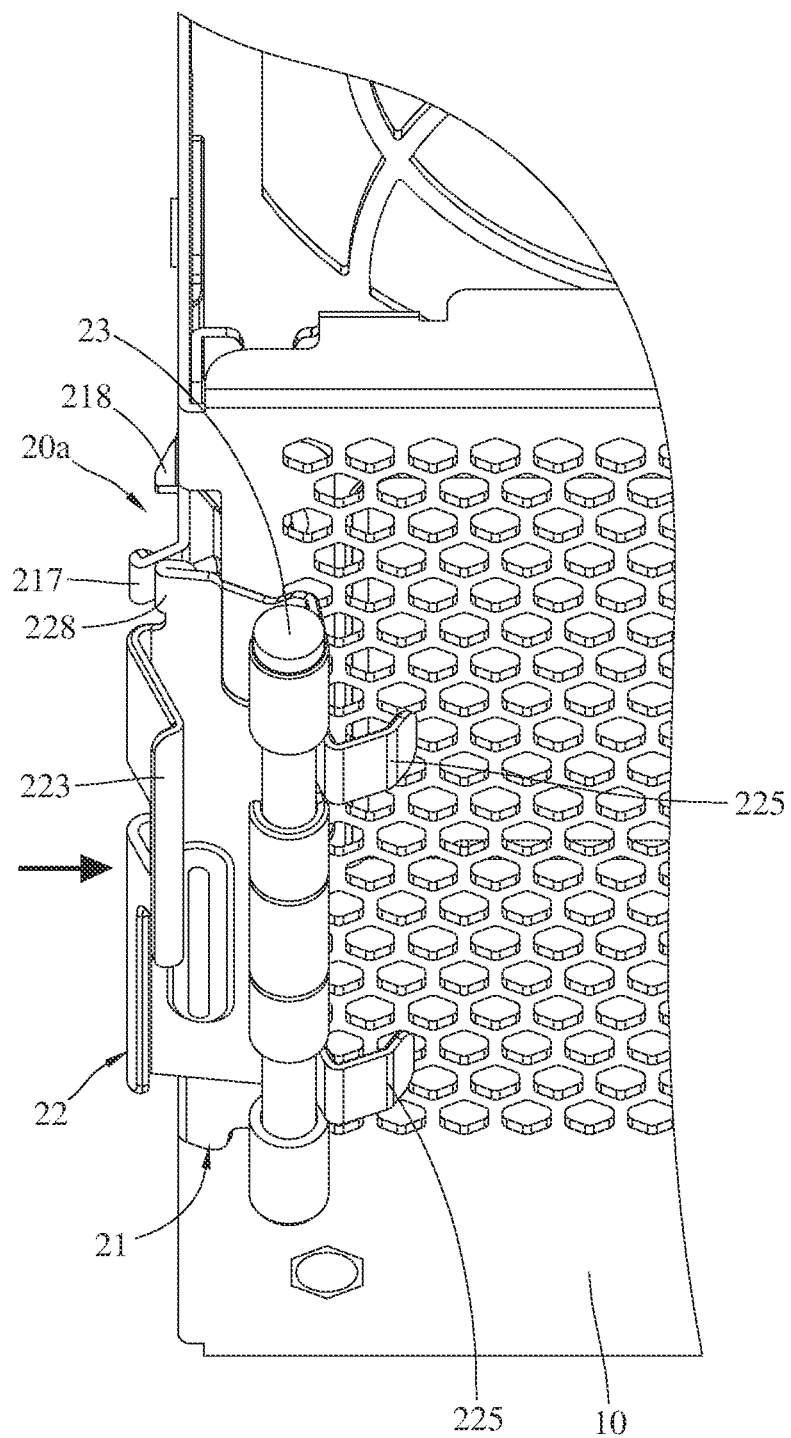
FIGS. 7-8 depict the operation of a fan cage assembly according to one embodiment of the disclosure.
Figure 10:
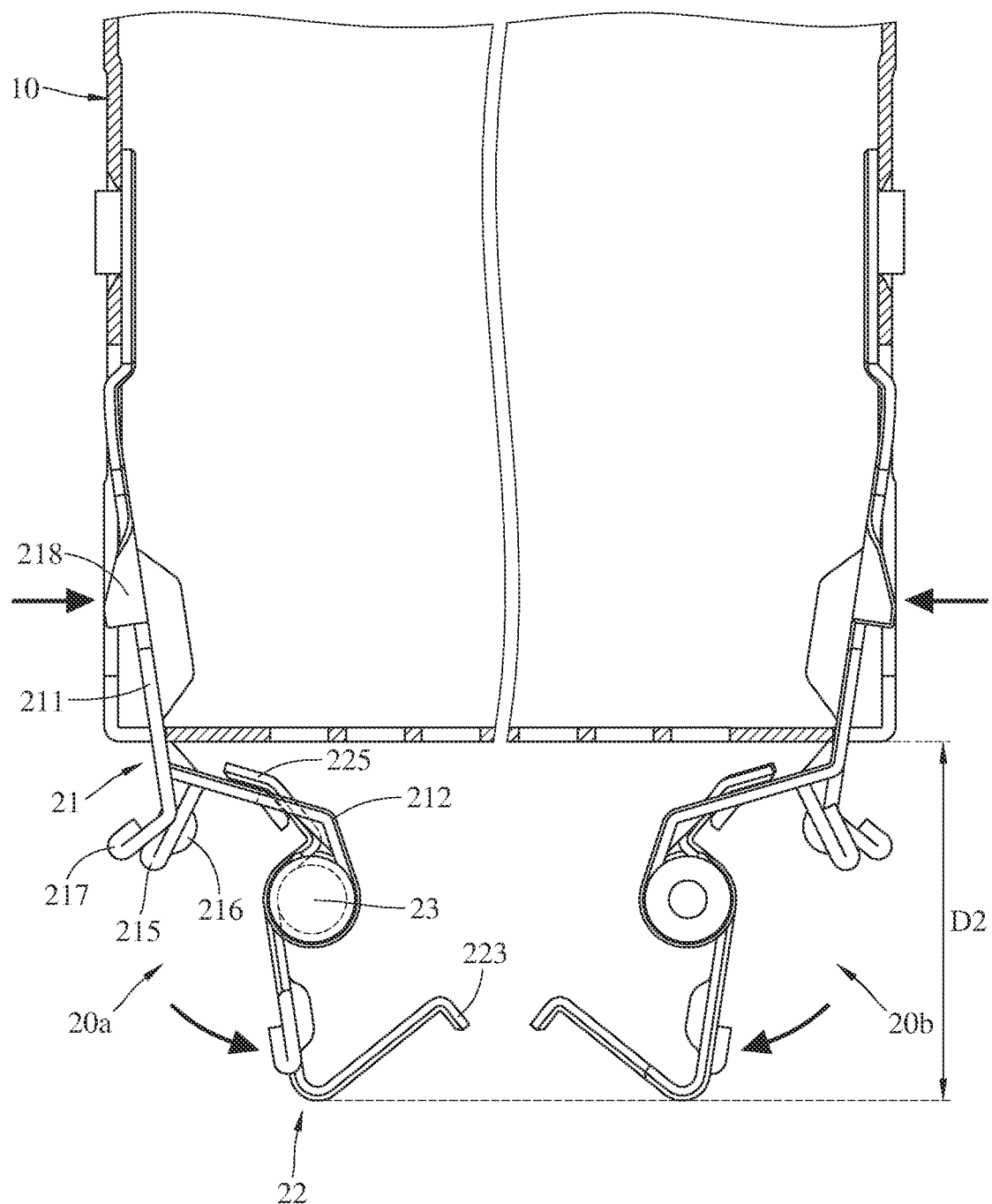
FIG. 10 is a top view of a fan cage assembly according to one embodiment of the disclosure when its operative members are switched to operative position.

The operative member 22 is movably disposed on the extension portion 212 of the mount member 21, thus the operative member 22 and the extension portion 212 of the mount member 21 are respectively located at different sides of the cage 10. For example, the mount portion 211 of the mount member 21 may be arranged at the left or right side of the cage 10 while the operative member 22 is movable at the rear side of the cage 10. Also, the operative member 22 is selectively movable to a stored position relative to the mount member 21 (as shown in FIGS. 5-6) to make the handle mechanism 20a switched to the stored status, and the operative member 22 is selectively movable to an operative position relative to the mount member 21 (as shown in FIGS. 8-10) to make the handle mechanism 20a switched to the operative status.

Specifically, in this embodiment, the operative member 22 is pivotably connected to the extension portion 212 of the mount member 21. The mount member 21 may further include a first mounting structure 213, the operative member 22 may include a main portion 220 and a second mounting structure 221, the first mounting structure 213 may be integrally formed with an edge (or, side) of the extension portion 212 located away from the mount portion 211, the second mounting structure 221 may be integrally formed with an edge (or, side) of the main portion 220, the first mounting structure 213 and the second mounting structure 221 are configured for the insertion of the shaft 23. Thus, the first mounting structure 213 and the second mounting structure 221 may be coaxially connected to the shaft 23, such that the operative member 22 is pivotably connected to the mount member 21 via the shaft 23.

Optionally, the mount member 21 may be engaged with the module casing 81 of the fan module 80 and may be selectively deformed by the operative member 22 to release the module casing 81. Specifically, the mount member 21 may include at least one retaining structure 218, and the mount portion 211 of the mount member 21 may include a fixed end 2111 and a free end 2112. The mount portion 211 may be disposed on the cage 10 via the fixed end 2111. The free end 2112 is located opposite to the fixed end 2111, in other words, the free end 2112 and the fixed end 2111 respectively are two opposite ends of the mount member 21. The free end 2112 is movable relative to the fixed end 2111 when being forced. The extension portion 212 is connected to the mount portion 211 via the free end 2112. The retaining structure 218 protrudes from a side of the mount portion 211 which is located opposite to the cage 10. The retaining structure 218 may be located between the fixed end 2111 and the free end 2112 of the mount portion 211 and may be configured to be engaged with the respective structure (not shown) on the module casing 81 when the fan cage assembly 1 reaches a predetermined position in the module casing 81. Thus, when the operative member 22 applies force to the extension portion 212 which is connected to the free end 2112, the extension portion 212 causes the mount portion 211 to elastically deform so as to cause the retaining structure 218 on the mount portion 211 to move relative to the cage 10, thereby releasing the retaining structure 218 from the module casing 81.

Optionally, the operative member 22 may include an operative portion 223 protruding outwardly from an edge (or, side) of the main portion 220 which is located opposite to the second mounting structure 221. The operative portion 223 is provided for user's finger to push the operative member 22. In the handle mechanism 20b, the operative member may include another operative portion which may have the same configuration and function as that of the handle mechanism 20a.

Optionally, the operative member 22 may further include at least one stopping structure 225 protruding outwardly from the edge (or, side) of the main portion 220 in which the second mounting structure 221 is located, the protruding directions of the mounting structure 221 and the stopping structure 225 are different. When the operative member 22 is switched to the operative position, the stopping structure 225 presses against the extension portion 212 of the mount member 21 so as to stop the operative member 22 at the operative position (as shown in FIG. 9).

Figure 4:
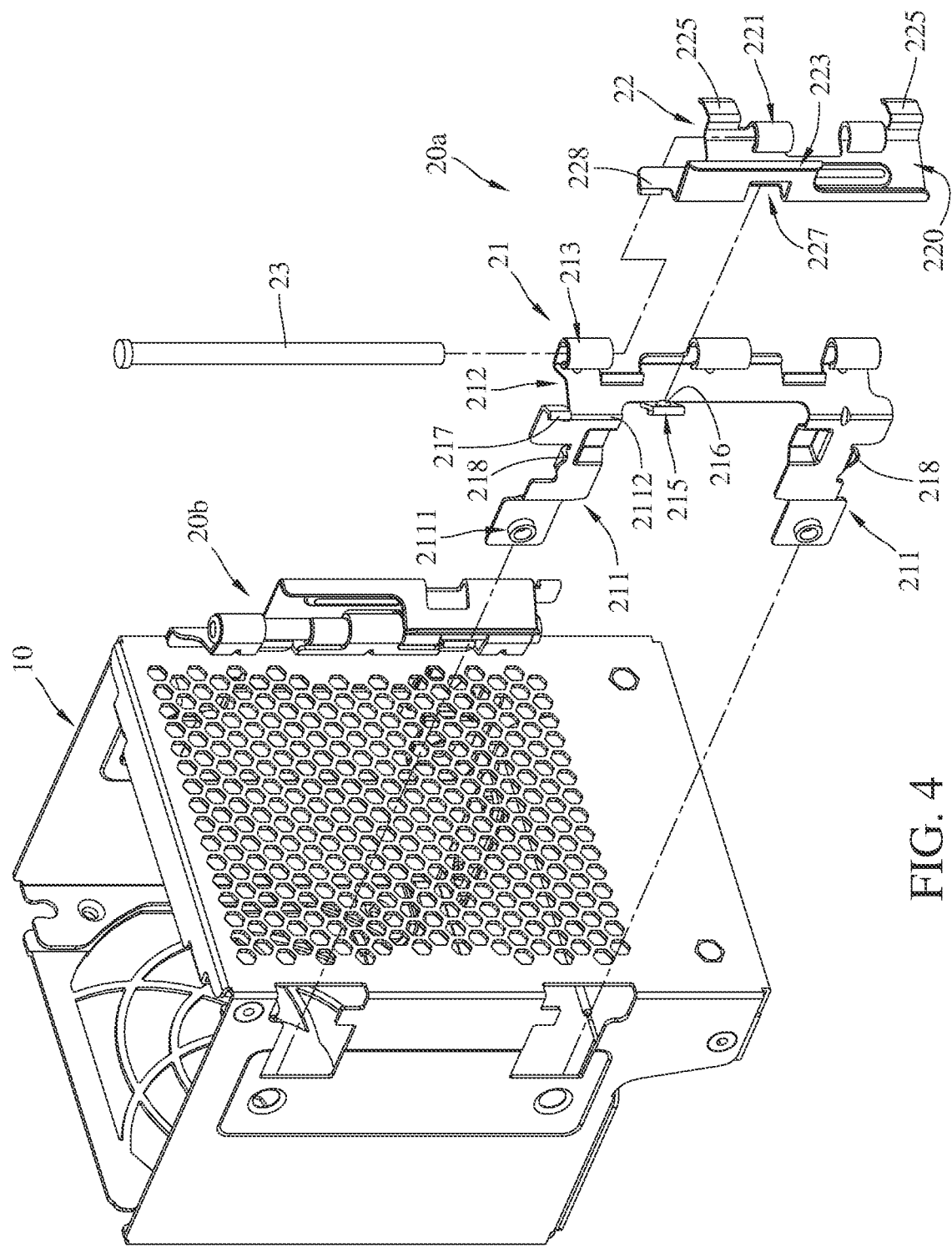
FIG. 4 is an exploded view of a fan cage assembly in FIG. 3.

Optionally, please refer to FIGS. 4 and 5, the mount member 21 may further include an elastic tab 215 and an engagement portion 216, the operative member 22 may have an engagement hole portion 227, the elastic tab 215 may protrude outwardly from a portion of the extension portion 212 which is located away from the first mounting structure 213, the engagement portion 216 may protrude from a surface of the elastic tab 215 facing the operative member 22, the engagement hole portion 227 may be located at a portion of the main portion 220 which is located away from the second mounting structure 221 and configured for the insertion of the elastic tab 215 of the mount member 21. When the operative member 22 is pivoted towards the stored position from the operative position, the elastic tab 215 may penetrate through the engagement hole portion 227. During such process, the edges that define the engagement hole portion 227 may push the engagement portion 216 on the elastic tab 215 so as to force the elastic tab 215 to elastically deform. When the edges move across the engagement portion 216, the elastic tab 215 returns to its original shape so that the engagement portion 216 retains the operative member 22 and therefore fix the operative member 22 in the stored position.

Optionally, continually refer to FIGS. 4 and 5, the mount member 21 may further include a pushed portion 217, and the operative member 22 may further include a pushing portion 228. The pushed portion 217 may be an elastic protrusion protruding outwardly from an edge (or, side) of the mount portion 211 in which the extension portion 212 is located (e.g., the free end 2112). The pushing portion 228 may be a protrusion protruding outwardly from the main portion 220. When the operative member 22 is in the stored position, the pushing portion 228 of the operative member 22 may be in tight contact with the pushed portion 217 of the mount member 21.

Then, the operation of the handle mechanism 20a will be described below with reference to FIGS. 5-6 and further reference to FIGS. 7-10. Firstly, in FIGS. 5-6, when the operative member 22 reaches the stored position, the elastic tab 215 of the mount member 21 penetrates through the engagement hole portion 227 of the operative member 22 so that the engagement portion 216 retains the operative member 22 in the stored position; meanwhile, the pushed portion 217 of the mount member 21 is pressed against by the pushing portion 228 of the operative member 22. The contact between the pushing portion 228 and the pushed portion 217 causes the mount portion 211 to elastically deform so as to force the retaining structure 218 on the mount portion 211 to move away from the cage 10. As such, the extension portion 212 may be kept in a position that makes the retaining structure 218 tightly engage with the module casing 81 and thereby enhancing the engagement between the fan cage assembly 1 and the module casing 81. At this moment, the handle mechanism 20a is in the stored status, a distance between the portion of the handle mechanism 20a which is located furthest away from the module casing 81 (or, the cage 10) and the module casing 81 (or, the cage 10) may denote to D1.

Then, the rear cover 91 as illustrated in FIG. 1 may be opened or removed to facilitate the operation of the handle mechanism 20a for the removal of the fan cage assembly 1 out of the module casing 81. To do so, as indicated by the arrows in FIGS. 7-8, the user can push the operative portion 223 of the operative member 22 so as to pivot the operative member 22 towards the operative position from the stored position. During this movement of the operative member 22, the pushing portion 228 of the operative member 22 disengages from the pushed portion 217 of the mount member 21. When the operative member 22 reaches the operative position, the stopping structure 225 operative member 22 presses against the extension portion 212 of the mount member 21. Specifically, in FIG. 9, when the operative member 22 in the operative position, the extension portion 212 of the mount member 21 is pressed against by the stopping structure 225 of the operative member 22 so as to stop the operative member 22 at the operative position. At this moment, the handle mechanism 20a is in the operative status. In FIG. 10, when the handle mechanism 20a is in the operative status, a distance between the portion of the handle mechanism 20a which is located furthest away from the module casing 81 (or, the cage 10) and the module casing 81 (or, the cage 10) increases to D2. That is, when the handle mechanism 20a is switched to the operative status, the outermost portion of the handle mechanism 20a protrudes from the cage by a second distance (i.e., D2). Referring to FIGS. 1, 6, and 10, D2>D1 and D2>D0; that is, when the handle mechanism 20a switches to the operative status from the stored status, the area of the handle mechanism 20a provided for held by user's fingers increases and thus facilitating the operation of the handle mechanism 20a.

Then or meanwhile, as indicated by the arrows, the user can further push the operative member 22. By doing so, the mount portion 211 is elastically deformed by the extension portion 212 of the mount member 21 so that the retaining structure 218 is disengaged from the module casing 81, then, the fan module casing 81 is allowed to be moved from the module casing 81 (as shown in FIG. 3) by pulling the operative members 22 of the handle mechanism 20a.

Accordingly, since the operative member 22 of the handle mechanism 20a is selectively movable between the stored position and the operative position, the handle mechanism 20a is selectively switched to a stored status that makes the handle mechanism 20a suitable for being arranged in a narrow space between the module casing 81 and the rear cover 91 or to an operative status that makes the handle mechanism 20a easier to operate by fingers. In other words, the handle mechanism 20a facilitates the placement and removal of the fan cage assembly 1 from a limited internal space of the housing 90 and therefore makes the fan cage assembly 1 possible to be applied to various environment.

Also, since the mount member 21 of the handle mechanism 20a is embedded at the cage 10 via the mount portion 211 and the operative member 22 is kept at the rear side of the cage 10 by the extension portion 212, the handle mechanism 20a only occupies a narrow space in lateral direction and thereby favorable for the fan cage assembly 1 to apply to an environment with relatively narrow lateral space.

Additionally, referring to FIG. 2, in each fan cage assembly 1, the operative members 22 of the handle mechanisms 20a and 20b which are located at two opposite sides of the cage 10 are misaligned with each other; in other words, in each fan cage assembly 1, the operative portions 223 of its handle mechanisms 20a and 20b may not correspond to each other. In such an arrangement, when the handle mechanisms 20a and 20b are in the stored position, the operative portions 223 of the operative members 22 of the adjacent fan cage assemblies 1 do not interfere with each other. This is also favorable for the fan cage assembly 1 to be applied to an environment with relatively narrow lateral space.

Figure 11:
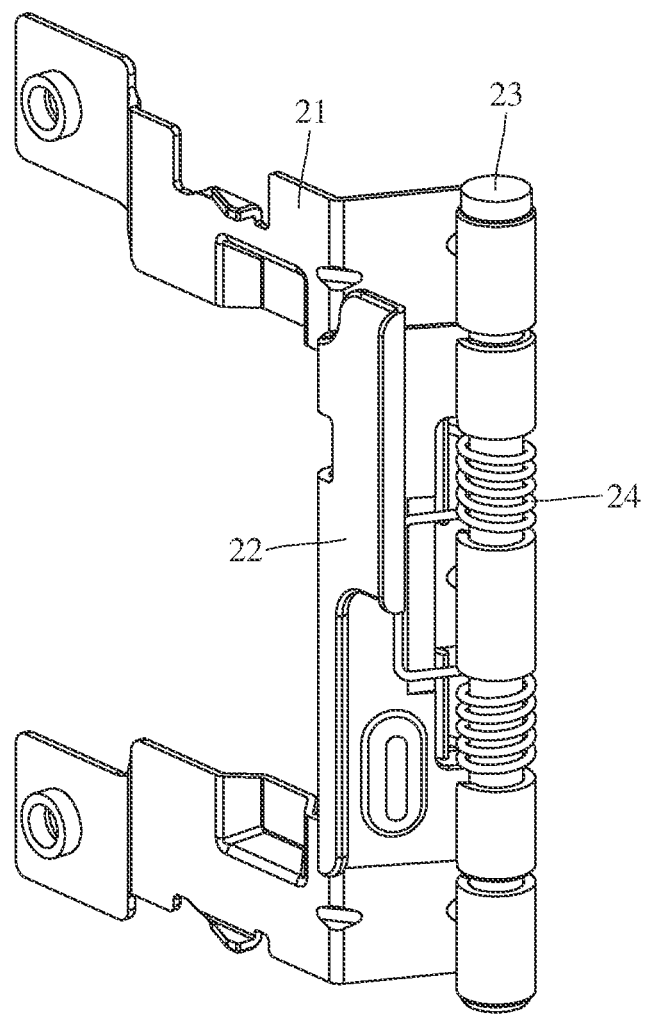
FIG. 11 is a perspective view of a handle mechanism according to another embodiment of the disclosure.
Figure 12:
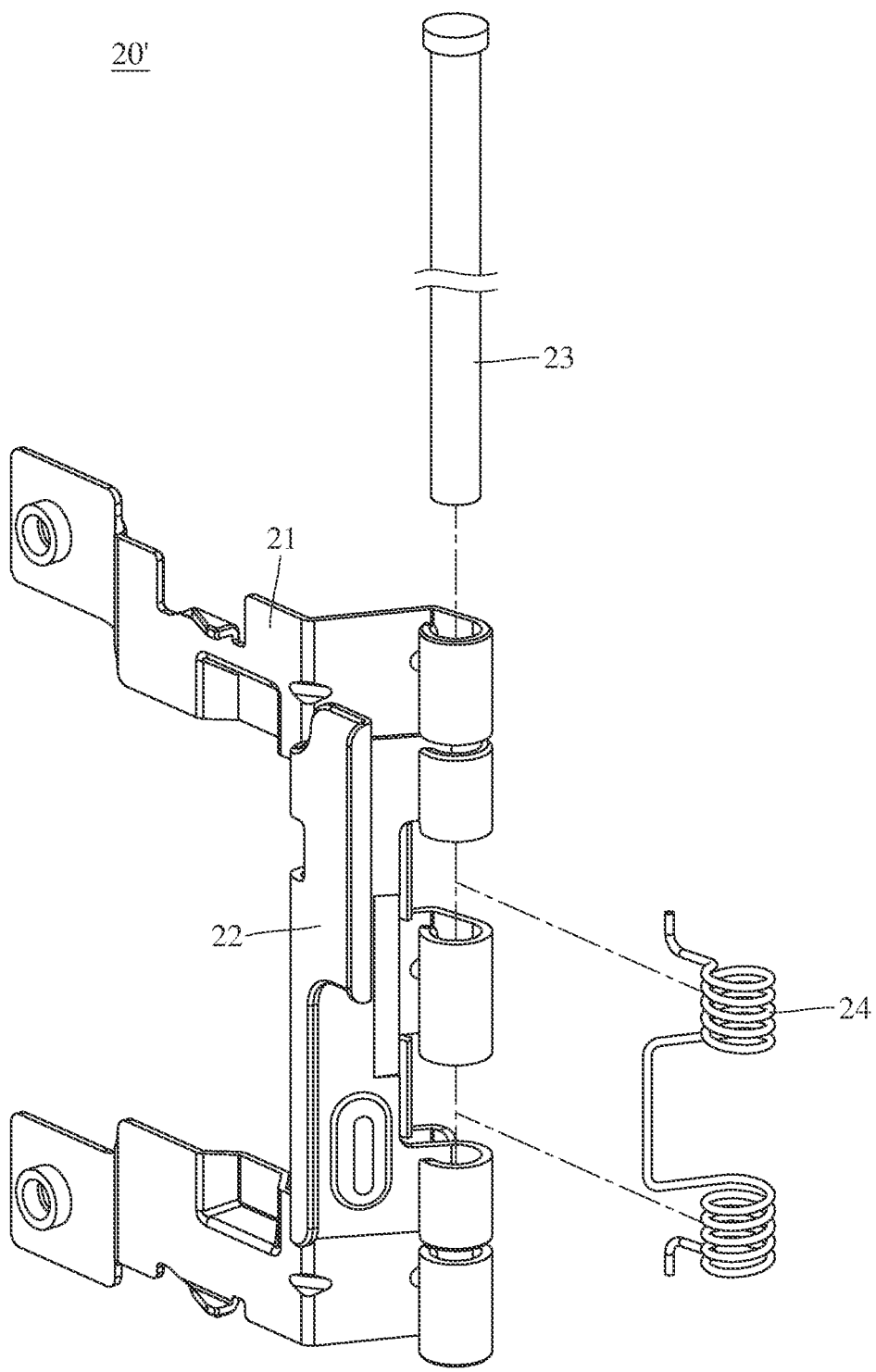
FIG. 12 is an exploded view of the handle mechanism in FIG. 11.

It is noted that the previous handle mechanisms are exemplary but not intended to limit the disclosure. For example, please refer to FIGS. 11-12, another embodiment of the disclosure provides a handle mechanism 20'. For the purpose of simplicity, only the difference between the embodiment in FIGS. 11-12 and previous embodiment will be described in detail below.

As shown, an elastic member 24 is sleeved on the shaft 23 of the handle mechanism 20', the elastic member 24 may be a torsion spring, the elastic member 24 may be arranged between the mount member 21 of the handle mechanism 20' and the operative member 22 and configured for forcing the operative member 22 to move towards the stored position. When the operative member 22 is forced to move towards the operative position, the elastic member 24 is deformed and stores restoring force to return the operative member 22 back to the stored position to facilitate the operation of the handle mechanism 20'.

Figure 13:
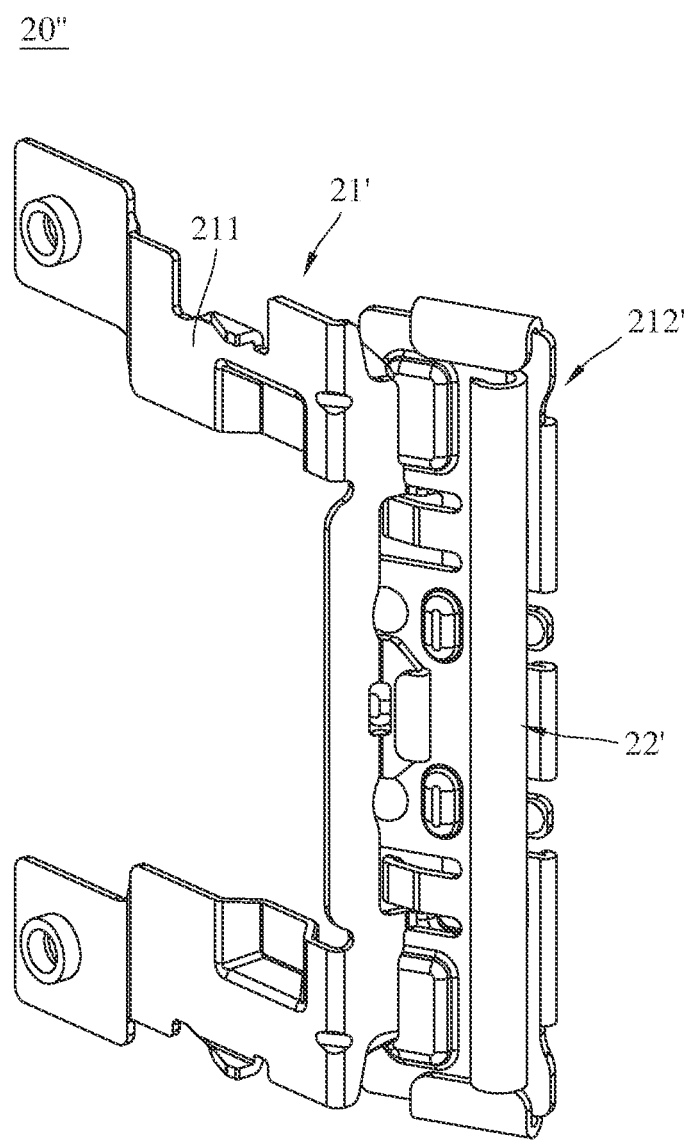
FIG. 13 is a perspective view of a handle mechanism according to another embodiment of the disclosure.
Figure 14:
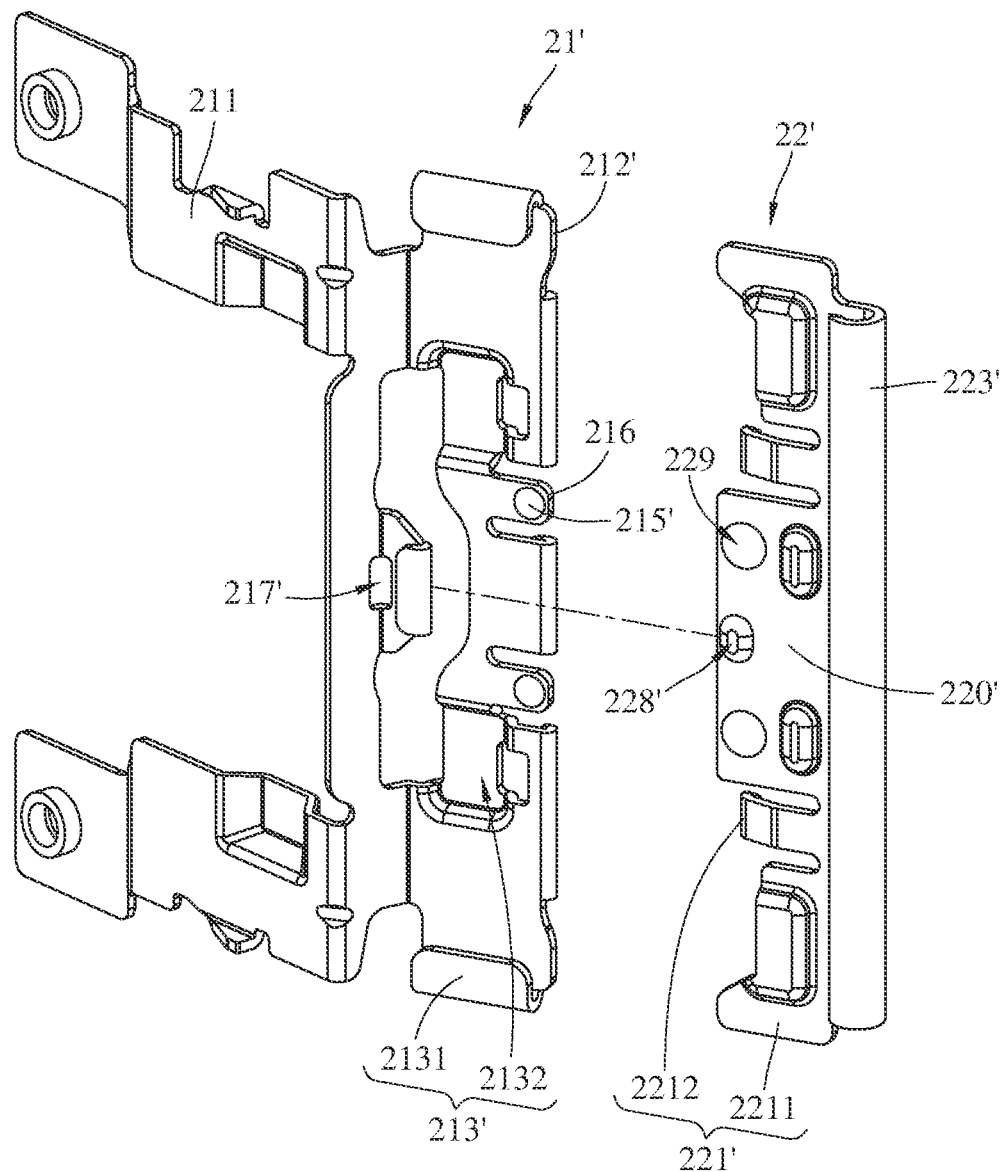
FIG. 14 is an exploded view of the handle mechanism in FIG. 13.

Alternatively, in some other embodiments, the shaft of the fan cage assembly may be integrally formed with the operative member or the mount member. Alternatively, in another embodiment, the operative member may be slidably disposed on the mount member. For example, please refer to FIGS. 13-14, another embodiment of the disclosure provides a handle mechanism 20". For the purpose of simplicity, only the difference between the embodiment in FIGS. 13-14 and previous embodiment will be described in detail below. As shown, an operative member 22' of the handle mechanism 20" may be directly slidably disposed on an extension portion 212' of a mount member 21', specifically, the mount member 21' is slidably and retractably disposed on the mount member 21' so as to be switchable between the stored position and the operative position.

Specifically, a first mounting structure 213' of the mount member 21' may include at least one guiding rail 2131, correspondingly, a second mounting structure 221' of the operative member 22' may include at least one lateral mating portion 2211, the guiding rail 2131 may define a slot located at side edge of the extension portion 212' of the mount member 21', the lateral mating portion 2211 may be the lateral portion of the main portion 220'. The lateral mating portion 2211 is slidably disposed in the guiding rail 2131. By pushing the operative portion 223' of the operative member 22' towards the stored position, the operative member 22' can slide towards the mount portion 211 along the mount member 21'. By pulling the operative member 22' away from the mount portion 211, the operative member 22' can slide towards the operative position along the extension portion 212'.

In addition, the mount member 21' may include a first positioning structure 217', the operative member 22' may include a second positioning structure 228', one of the first positioning structure 217' and the second positioning structure 228' may be a recess or a through hole, and the other one of the first positioning structure 217' and the second positioning structure 228' may be a mating protrusion. When the operative member 22' is in the stored position, the first positioning structure 217' and the second positioning structure 228' may be engaged with each other to secure the operative member 22' in the stored position.

Optionally, the main portion 220' of the operative member 22' may have at least one positioning portion 229 configured to engage with the engagement portion 216 on an elastic tab 215' of the mount member 21' when the operative member 22' is in the stored position and therefore can fix the operative member 22' in the stored position.

Optionally, the first mounting structure 213' of the mount member 21' may further include at least one groove portion 2132, correspondingly, the second mounting structure 221' of the operative member 22' may further include at least one elastic arm portion 2212, the groove portion 2132 may be located at the extension portion 212', the elastic arm portion 2212 may extend outwardly from the main portion 220' and part of the elastic arm portion 2212 is slidably disposed at the groove portion 2132, thus the groove portion 2132 limits the movable range of the elastic arm portion 2212 so as to limit the slidable distance of the operative member 22' relative to the mount member 21'. This prevents the operative member 22' from falling off from the mount member 21' while moving between the stored position and the operative position.

Figure 15:
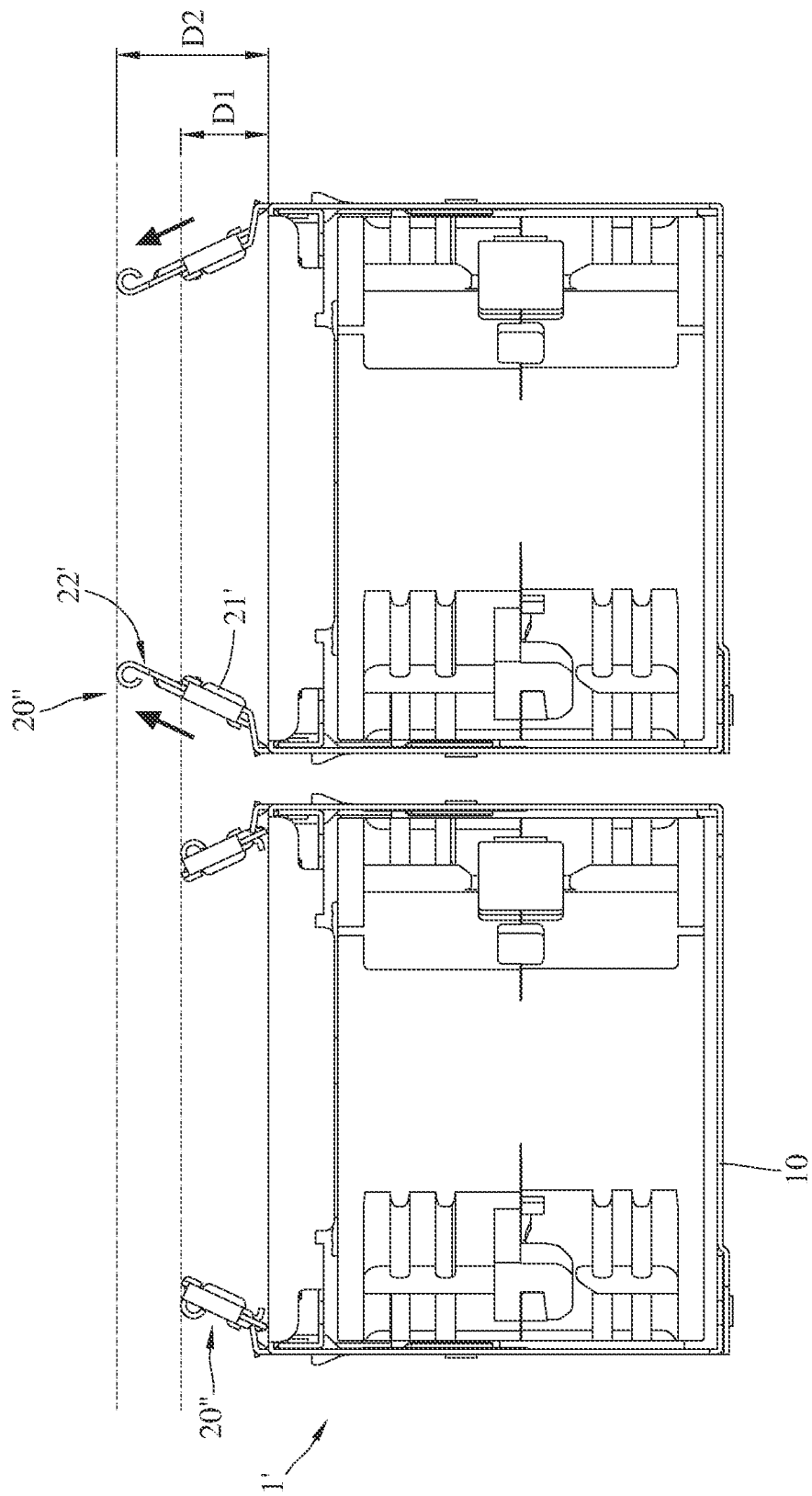
FIG. 15 is a top view of a fan module when the operative members of the handle mechanisms in FIG. 13 are switched to operative position.

Then, please refer to FIG. 15, as can be seen from the fan cage assembly 1' at the left side of FIG. 15, the operative member 22' is in the stored position, thus the distance between the part of the handle mechanism 20" located furthest away from the module casing 81 (or, the cage 10) and the module casing 81 (or, the cage 10) remains D1, thus the handle mechanism 20" is suitable for being arranged in a narrow space. Then, as can be seen from the fan cage assembly 1' at the right side of FIG. 15, the operative member 22' is switched to the operative position, and the distance between the part of the handle mechanism 20" located furthest away from the module casing 81 (or, the cage 10) and the module casing 81 (or, the cage 10) increases to D2, in this position, the handle mechanism 20" becomes easier to operate by fingers and thereby facilitating the placement and removal of the fan cage assembly 1' from a limited internal space.

According to the fan cage assembly and the electronic device as discussed in the above embodiments of the disclosure, the extension portion and the mount portion of the mount member of the handle mechanism are respectively located at different sides of the cage and the operative member is movably disposed on the extension portion, thus, the operative member is able to be movable at a selected side of the cage so as to switch the status of the handle mechanism, thereby making the handle mechanism suitable for being arranged in a narrow space and easier to operate by fingers. As such, the handle mechanism is favorable for facilitating the placement and removal of the fan cage assembly from a limited internal space.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A fan cage assembly, comprising:
a cage; and
a handle mechanism comprising:
a mount member comprising a mount portion and an extension portion which are respectively located at different sides of the cage; and
an operative member movably disposed on the extension portion of the mount member.

2. The fan cage assembly according to claim 1, wherein the operative member is selectively switched between a stored position and an operative position;
when the operative member is in the stored position, an outermost portion of the handle mechanism protrudes from the cage by a first distance;
when the operative member is in the operative position, an outermost portion of the handle mechanism protrudes from the cage by a second distance, and the second distance is shorter than the first distance.

3. The fan cage assembly according to claim 2, wherein the operative member is pivotably connected to the extension portion of the mount member.

4. The fan cage assembly according to claim 3, wherein the mount member further comprises a retaining structure, the mount portion of the mount member comprises a fixed end and a free end located opposite to each other, the mount portion is fixed to the cage via the fixed end, the extension portion of the mount member is connected to the mount portion via the free end, the retaining structure protrudes from the mount portion and is located between the fixed end and the free end, when the operative member is in the stored position, the retaining structure extends out an outer surface of the cage.

5. The fan cage assembly according to claim 4, wherein the mount member further comprises a pushed portion which extends outwardly from the free end of the mount portion, the operative member comprises a main portion and a pushing portion which extends outwardly from the main portion, when the operative member is in the stored position, the pushed portion is pressed against by the pushing portion.

6. The fan cage assembly according to claim 3, wherein the operative member comprises a main portion and a stopping structure which extends outwardly from the main portion, when the operative member is in the operative position, the extension portion of the mount member is pressed against by the stopping structure.

7. The fan cage assembly according to claim 2, wherein the mount member further comprises an elastic tab and an engagement portion which protrudes from the elastic tab, the operative member has an engagement hole portion, when the operative member is in the stored position, the elastic tab penetrates through the engagement hole portion, and the operative member is pressed against by the engagement portion.

8. The fan cage assembly according to claim 2, wherein the operative member is slidably disposed on the extension portion of the mount member.

9. The fan cage assembly according to claim 8, wherein the mount member further comprises a groove portion located at the extension portion, the operative member comprises a main portion and an elastic arm portion which extends outwardly from the main portion, a portion of the elastic arm portion is slidably disposed in the groove portion.

10. The fan cage assembly according to claim 1, wherein the handle mechanism is a first handle mechanism, the fan cage assembly further comprises a second handle mechanism, the first handle mechanism and the second handle mechanism are respectively located at two opposite sides of the cage, the second handle mechanism comprises another mount member and another operative member, the another mount member of the second handle mechanism comprises another mount portion and another extension portion, the another extension portion and the another mount portion of the second handle mechanism are respectively located at different sides of the cage, the another operative member of the second handle mechanism is movably disposed on the another extension portion of the second handle mechanism, the first handle mechanism has an operative portion, the second handle mechanism has another operative portion, and the operative portion of the first handle mechanism and the another operative portion of the second handle mechanism are misaligned with each other.

11. An electronic device, comprising:
 a housing; and
 a fan module, comprising:
 a cage disposed on the housing; and
 a handle mechanism comprising:
 a mount member comprising a mount portion and an extension portion respectively located at different sides of the cage; and
 an operative member movably disposed on the extension portion of the mount member.

12. The electronic device according to claim 11, further comprising a rear cover disposed on the housing, wherein the fan module further comprises a module casing removably accommodated in the housing, the cage is removably accommodated in the module casing and arranged adjacent to a side of the module casing located close to the rear cover.

13. The electronic device according to claim 12, wherein the operative member is selectively switched between a stored position and an operative position;
 when the operative member is in the stored position, an outermost portion of the handle mechanism protrudes from the cage by a first distance;
 when the operative member is in the operative position, an outermost portion of the handle mechanism protrudes from the cage by a second distance, and the second distance is shorter than the first distance.

14. The electronic device according to claim 13, wherein the operative member is pivotably connected to the extension portion of the mount member, the mount member further comprises a retaining structure, the mount portion of the mount member comprises a fixed end and a free end located opposite to each other, the mount portion is fixed to the cage via the fixed end, the extension portion of the mount member is connected to the mount portion via the free end, the retaining structure protrudes from the mount portion and is located between the fixed end and the free end, when the operative member is in the stored position, the retaining structure extends out an outer surface of the cage and engages with the module casing.

15. The electronic device according to claim 14, wherein the mount member further comprises a pushed portion which extends outwardly from the free end of the mount portion, the operative member comprises a main portion and a pushing portion which extends outwardly from the main portion, when the operative member is in the stored position, the pushed portion is pressed against by the pushing portion, and the retaining structure on the mount portion extends out the outer surface of the cage.

16. The electronic device according to claim 14, wherein the operative member comprises a main portion and a stopping structure which extends outwardly from the main portion, when the operative member is in the operative position, the extension portion of the mount member is pressed against by the stopping structure.

17. The electronic device according to claim 13, wherein the mount member further comprises an elastic tab and an engagement portion which protrudes from the elastic tab, the operative member has an engagement hole portion, when the operative member is in the stored position, the elastic tab penetrates through the engagement hole portion, and the operative member is pressed against by the engagement portion.

18. The electronic device according to claim 13, wherein the operative member is slidably disposed on the extension portion of the mount member.

19. The electronic device according to claim 11, wherein the mount member further comprises a groove portion located at the extension portion, the operative member comprises a main portion and an elastic arm portion which extends outwardly from the main portion, a portion of the elastic arm portion is slidably disposed in the groove portion.

20. The electronic device according to claim 11, wherein the handle mechanism is a first handle mechanism, the fan cage assembly further comprises a second handle mechanism, the first handle mechanism and the second handle mechanism are respectively located at two opposite sides of the cage, the second handle mechanism comprises another mount member and another operative member, the another mount member of the second handle mechanism comprises another mount portion and another extension portion, the another extension portion and the another mount portion of the second handle mechanism are respectively located at different sides of the cage, the another operative member of the second handle mechanism movably disposed on the another extension portion of the second handle mechanism, the another operative member of the second handle mechanism is movably disposed on the another extension portion of the second handle mechanism, the first handle mechanism has an operative portion, the second handle mechanism has another operative portion, and the operative portion of the first handle mechanism and the another operative portion of the second handle mechanism are misaligned with each other.

* * * * *